United States Patent
Ting et al.

(10) Patent No.: US 7,508,053 B2
(45) Date of Patent: Mar. 24, 2009

(54) SEMICONDUCTOR MOS TRANSISTOR DEVICE AND METHOD FOR MAKING THE SAME

(75) Inventors: Shyh-Fann Ting, Kao-Hsiung Hsien (TW); Cheng-Tung Huang, Kao-Hsiung (TW); Wen-Han Hung, Kao-Hsiung (TW); Tzyy-Ming Cheng, Hsin-Chu (TW); Tzer-Min Shen, Hsin-Chu (TW); Yi-Chung Sheng, Tai-Chung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 11/927,642

(22) Filed: Oct. 29, 2007

(65) Prior Publication Data

US 2008/0093627 A1      Apr. 24, 2008

Related U.S. Application Data

(62) Division of application No. 11/307,660, filed on Feb. 16, 2006, now Pat. No. 7,342,284.

(51) Int. Cl.
*H01L 23/58* (2006.01)

(52) U.S. Cl. ............... 257/647; 257/649; 257/374; 257/382; 257/E29.193; 438/221; 438/199
(58) Field of Classification Search ............... 257/647, 257/E29.193
See application file for complete search history.

(56) References Cited

U.S. PATENT DOCUMENTS

| | | | |
|---|---|---|---|
| 6,468,904 B1 | 10/2002 | Chen | |
| 7,268,048 B2 * | 9/2007 | Goh et al. | 438/296 |
| 2007/0164357 A1 | 7/2007 | Clevenger | |

* cited by examiner

*Primary Examiner*—Tu-Tu V Ho
(74) *Attorney, Agent, or Firm*—Winston Hsu

(57) ABSTRACT

A method of manufacturing a metal-oxide-semiconductor (MOS) transistor device is disclosed. A gate dielectric layer is formed on an active area of a substrate. A gate electrode is patterned on the gate dielectric layer. The gate electrode has vertical sidewalls and a top surface. A liner is formed on the vertical sidewalls of the gate electrode. A nitride spacer is formed on the liner. An ion implanted is performed to form a source/drain region. After salicide process, an STI region that isolates the active area is recessed, thereby forming a step height at interface between the active area and the STI region. The nitride spacer is removed. A nitride cap layer that borders the liner is deposited. The nitride cap layer has a specific stress status.

23 Claims, 14 Drawing Sheets

| | (1) No Silicon Nitride Cap Layer No STI Etch Back | (2) 1000 Å Tensile Stressed Silicon Nitride | (3) 1000 Å Tensile Stressed Silicon Nitride +STI Etch Back |
|---|---|---|---|
| NMOS W:1 μm L:32nm | 791 μA/μm | 835 μA/μm (+5.6%) | 872 μA/μm (+10.2%) |
| | (1) No Silicon Nitride Cap Layer No STI Etch Back | (2) 1000 Å Compressive-stressed Silicon Nitride | (2) 1000 Å Compressive-stressed Silicon Nitride +STI Etch Back |
| PMOS W:1 μm L:32nm | 333 μA/μm | 419 μA/μm (+25.8%) | 428 μA/μm (+28.4%) |

FIG. 12

SEMICONDUCTOR MOS TRANSISTOR DEVICE AND METHOD FOR MAKING THE SAME

CROSS REFERENCE TO RELATED APPLICATIONS

This application claims priority from U.S. application Ser. No. 11/307,660 by Ting et al., filed Feb. 16, 2006, entitled "Semiconductor MOS Transistor Device And Method For Making The Same".

BACKGROUND OF THE INVENTION

1. Field of the Invention

The present invention generally relates to the field of semiconductor transistor devices and, more particularly, to silicon nitride spacer-less semiconductor NMOS and PMOS transistor devices having improved saturation current and electrical performance.

2. Description of the Prior Art

High-speed metal-oxide-semiconductor (MOS) transistor devices have been proposed in which a strained silicon (Si) layer, which has been grown epitaxially on a Si wafer with a silicon germanium (SiGe) layer disposed therebetween, is used for the channel area. In this type of strained Si-FET, a biaxial tensile strain occurs in the silicon layer due to that SiGe has a larger lattice constant than Si, and as a result, the Si band structure alters, the degeneracy is lifted, and the carrier mobility increases. Consequently, using this strained Si layer for a channel area typically enables a 1.5 to 8-fold speed increase.

FIGS. 1-3 are schematic cross-sectional diagrams illustrating a prior art method of fabricating a semiconductor NMOS transistor device 10. As shown in FIG. 1, the conventional NMOS transistor device 10 generally includes a semiconductor substrate generally comprising a silicon layer 16 having a source 18 and a drain 20 separated by a channel region 22. The silicon layer 16 is typically a strained silicon layer formed by epitaxially growing a silicon layer on a SiGe layer (not shown). Ordinarily, the source 18 and drain 20 further border a shallow-junction source extension 17 and a shallow-junction drain extension 19, respectively. A thin oxide layer 14 separates a gate 12, generally comprising polysilicon, from the channel region 22.

In the device 10 illustrated in FIG. 1, the source 18 and drain 20 are $N^+$ regions having been doped by arsenic, antimony or phosphorous. The channel region 22 is generally boron doped. A silicon nitride spacer 32 is formed on sidewalls of the gate 12. A liner 30, generally comprising silicon dioxide, is interposed between the gate 12 and the silicon nitride spacer 32. A salicide layer 42 is selectively formed on the exposed silicon surface of the device 10. Fabrication of an NMOS transistor such as the device 10 illustrated in FIG. 1 is well known in the art and will not be discussed in detail herein.

Referring to FIG. 2, after forming the NMOS transistor device 10, a silicon nitride cap layer 46 is typically deposited thereon. As shown in FIG. 2, the silicon nitride cap layer 46 covers the salicide layer 42 and the silicon nitride spacer 32. The thickness of the silicon nitride cap layer 46 is typically in the range of between 200 angstroms and 400 angstroms for subsequent etching stop purposes. A dielectric layer 48 such as silicon oxide or the like is deposited over the silicon nitride cap layer 46. The dielectric layer 48 is typically much thicker than the silicon nitride cap layer 46.

Referring to FIG. 3, subsequently, conventional lithographic and etching processes are carried out to form a contact hole 52 in the dielectric layer 48 and in the silicon nitride cap layer 46. As aforementioned, the silicon nitride cap layer 46 acts as an etching stop layer during the dry etching process to alleviate source/drain damages caused by the etchant substances.

A need exists in this industry to provide an inexpensive method for making a MOS or CMOS transistor device having improved functionality and performance.

SUMMARY OF THE INVENTION

It is the primary object of the present invention to provide a method of manufacturing a silicon nitride spacer-less semiconductor MOS/CMOS transistor devices having improved performance.

According to the claimed invention, a method of manufacturing a metal-oxide-semiconductor (MOS) transistor device is disclosed. The method comprises the following steps:

providing a semiconductor substrate having thereon an active area isolated by a shallow trench isolation (STI) region;

forming a gate dielectric layer on the active area;

forming a gate electrode on the gate dielectric layer, wherein the gate electrode has vertical sidewalls and a top surface;

forming a liner on the vertical sidewalls of the gate electrode;

forming a silicon nitride spacer on the liner;

ion implanting the active area using the gate electrode and the silicon nitride spacer as an implantation mask, thereby forming a source/drain region of the MOS transistor device in the active area;

forming a silicide layer on the top surface of the gate electrode and on the source/drain region;

performing an etching process to etch away a thickness of the STI region, thereby forming a step height h at interface between the active area and the STI region;

removing the silicon nitride spacer; and forming a stressed cap layer that borders the liner, wherein the stressed cap layer has a specific stress status and extends to the STI region.

From one aspect of the present invention, a MOS transistor device is provided. The MOS transistor device includes a semiconductor substrate having thereon an active area; an shallow trench isolation (STI) region isolating the active area, wherein a step height h is formed between the STI region and the active area; a gate dielectric layer on the active area; a gate electrode on the gate dielectric layer, wherein the gate electrode has vertical sidewalls and a top surface; a liner on the vertical sidewalls of the gate electrode; a source region in the active area; a drain region separated from the source region by a channel region under the gate electrode; a silicide layer formed on the top surface of the gate electrode, on the source region and on the drain region; and a stressed cap layer covering the liner and the silicide layer and extending to the STI region, wherein the stressed cap layer has a specific stress status.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 12 demonstrates the measured current for both N/PMOS transistors (with gate length L of 32 nm and a gate width W of 1 μm) in three different conditions;

DETAILED DESCRIPTION

Figure 1:
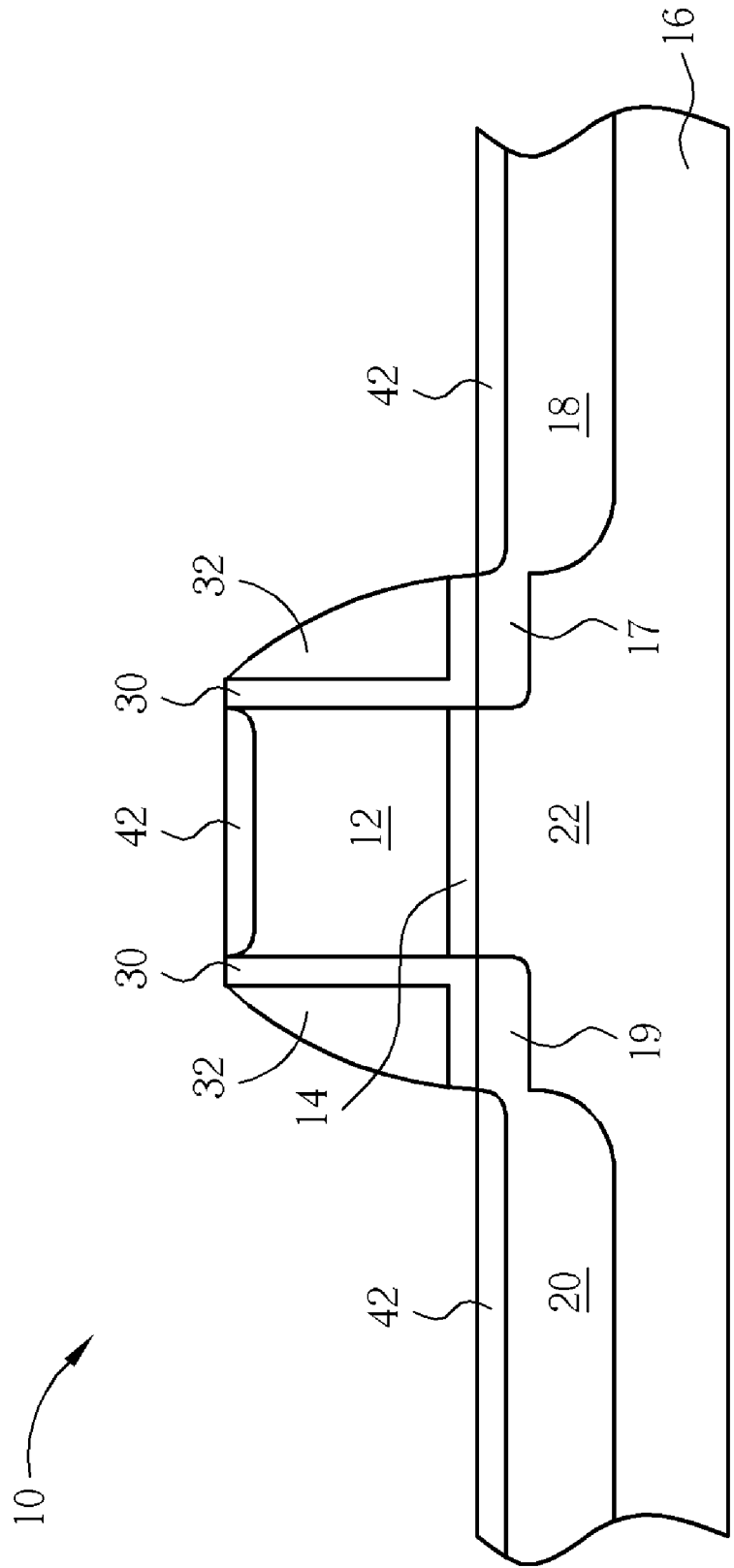
FIGS. 1-3 are schematic cross-sectional diagrams illustrating a prior art method of fabricating a semiconductor NMOS transistor device.
Figure 2:
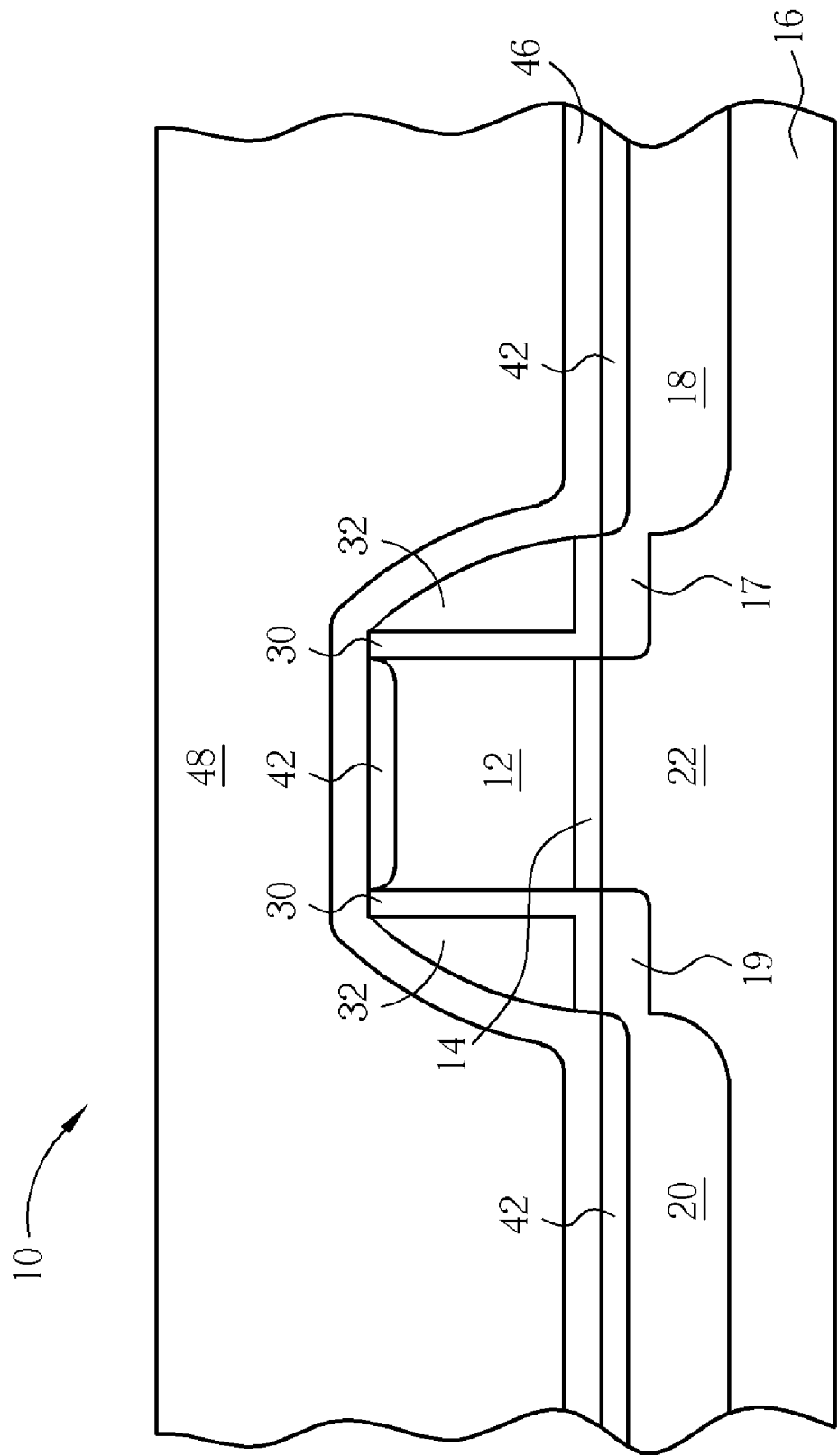
Figure 3:
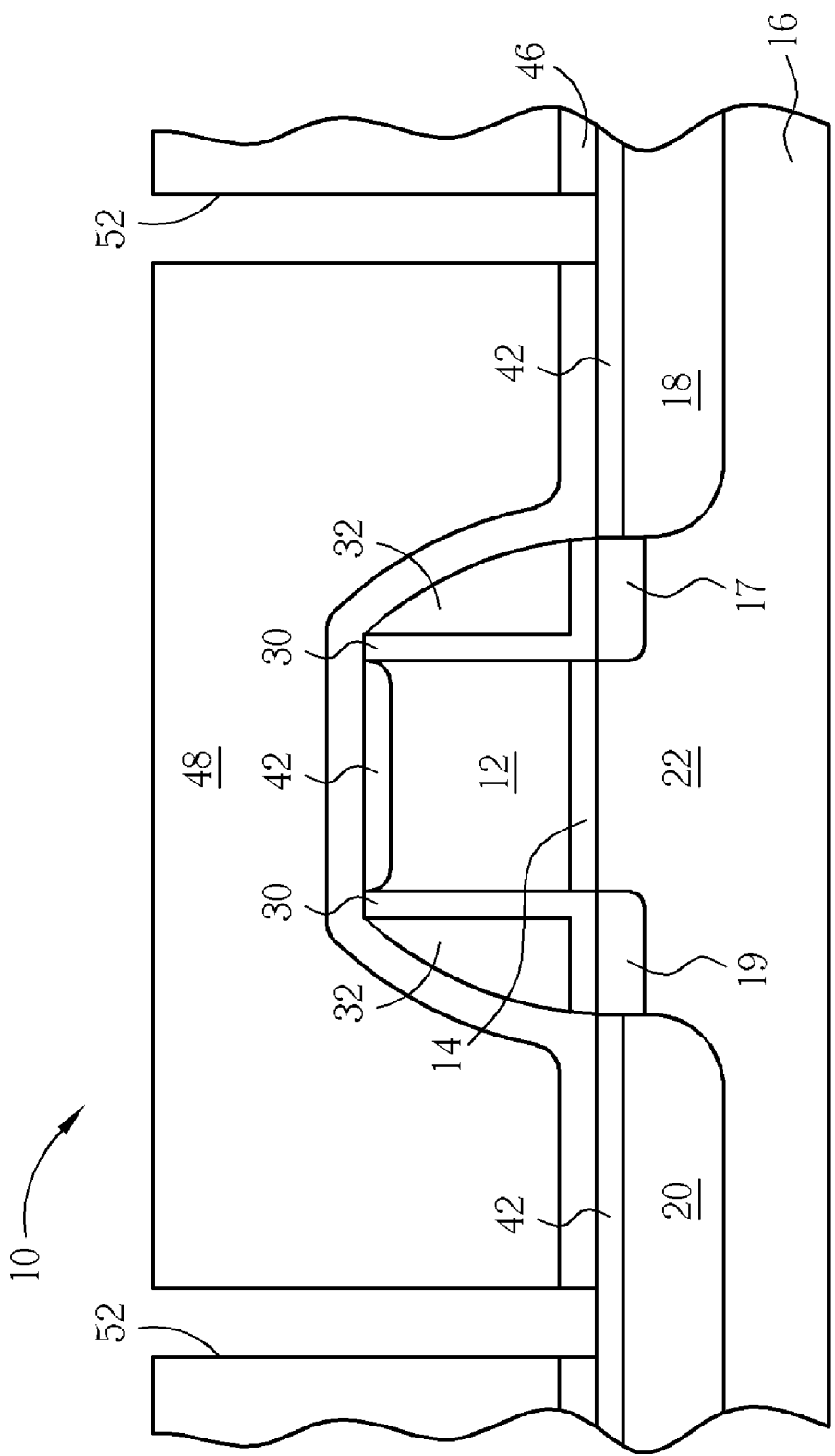

Please refer to FIGS. 4-11. FIGS. 4-11 are schematic cross-sectional diagrams illustrating a method of fabricating semiconductor MOS transistor devices 10 and 100 in accordance with one preferred embodiment of the present invention, wherein like number numerals designate similar or the same parts, regions or elements. It is to be understood that the drawings are not drawn to scale and are served only for illustration purposes. It is to be understood that some lithographic and etching processes relating to the present invention method are known in the art and thus not explicitly shown in the drawings.

Figure 4:
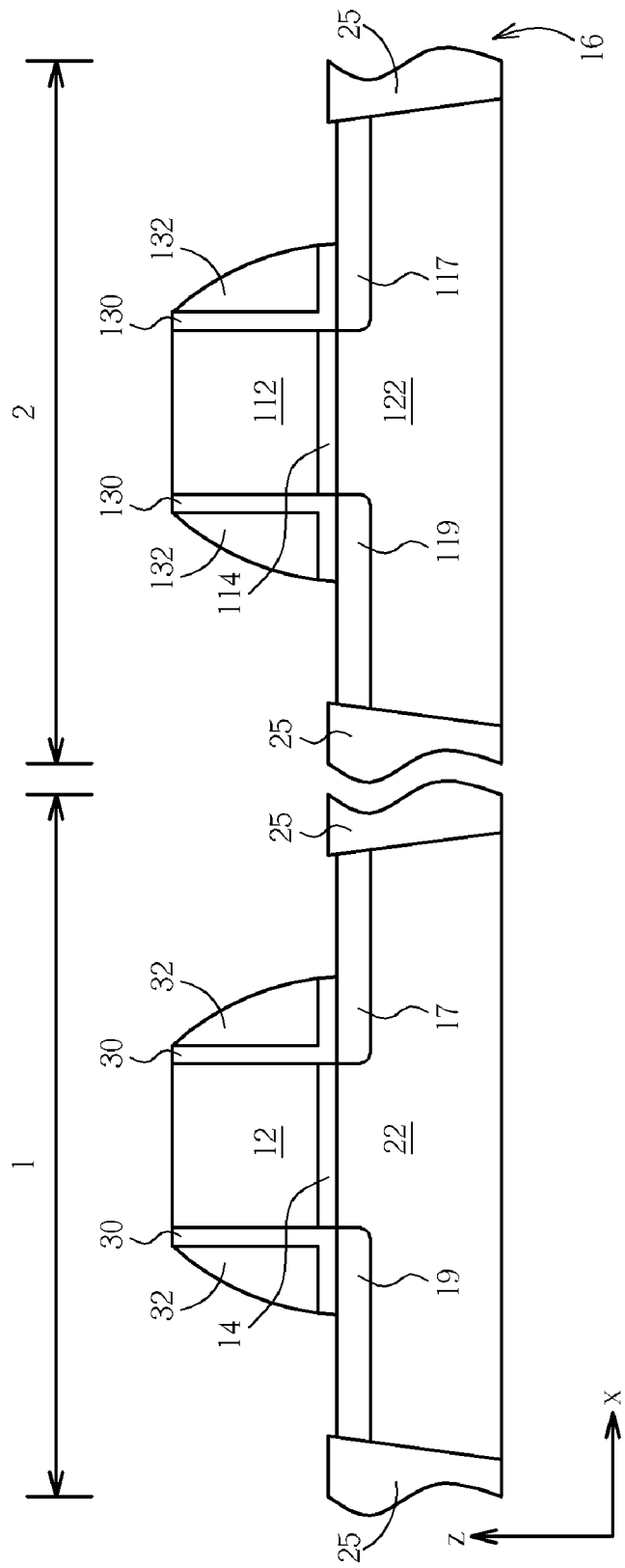
FIGS. 4-11 are schematic cross-sectional diagrams illustrating a method of fabricating semiconductor MOS transistor devices in accordance with one preferred embodiment of the present invention.

The present invention pertains to a method of fabricating MOS transistor devices or CMOS devices of integrated circuits. A CMOS process is demonstrated through FIGS. 4-11. As shown in FIG. 4, a semiconductor substrate generally comprising thereon a silicon layer 16 is prepared, wherein region 1 thereof is used to fabricate an NMOS device 10, while region 2 is used to fabricate a PMOS device 100. According to this invention, the semiconductor substrate may be a silicon substrate or a silicon-on-insulator (SOI) substrate, but not limited thereto. Preferably, the semiconductor substrate is silicon based, (e.g., silicon a silicon alloy or a combination thereof including Si, SiGe, SiC, SiGeC) although any suitable semiconductor material may be used including, but not limited to GaAs, InAs, InP or other III/V compound semiconductors. The semiconductor substrate may also include a multilayer structure in which at least the top layer thereof is a semiconductor. The method for forming the intermediate MOS structure depicted in FIG. 4 generally comprises forming shallow trench isolation (STI) structure 25 in the silicon layer 16; forming gate dielectric layers 14 and 114; forming gates 12 and 112; forming liners 30 and 130; ion implanting shallow junction source/drain extensions; and forming spacers 32 and 132.

Using suitable implant masks, a shallow-junction source extension 17 and a shallow-junction drain extension 19 are formed in the silicon layer 16 within the region 1. The source extension 17 and drain extension 19 are separated by N channel 22. In region 2, likewise, a shallow-junction source extension 117 and a shallow-junction drain extension 119 are formed in the silicon layer 16 and are separated by P channel 122.

Thin gate oxide layers 14 and 114 separate gates 12 and 112 from the channels 22 and 122, respectively. The gates 12 and 112 generally comprise polysilicon. The gate oxide layers 14 and 114 may be made of silicon dioxide. However, in another case, the gate oxide layers 14 and 114 may be made of any suitable high-k materials known in the art. The gate dielectric 14 or 114 is formed on the surface of a semiconductor material using a suitable formation step such as for example, depositing the dielectric, a thermal oxidation, nitridation or oxynitridation. Combinations of the aforementioned processes may also be used in forming the gate dielectric. The gate dielectric is an insulating material including an oxide, nitride, oxynitride or any combination thereof. A highly preferred insulating material that may be employed in the present invention as the gate dielectric is nitrided $SiO_2$ or oxynitride. Although it is preferred to use nitrided $SiO_2$ or oxynitride as the gate dielectric material, the present invention also contemplates using insulating materials, i.e., dielectrics, which have a higher dielectric constant, k, than nitrided $SiO_2$. For example, the gate dielectric may include a oxynitride-nitride stack, a pure nitride, a high-k oxide or oxynitride or respective silicate such as $Al_2O_3$, $HfO_2$, $ZrO_2$, $HfO_xN_y$, $HfSi_xO_yN_z$.

Preferably, the gate 12 or 112 is made of doped polysilicon. However, the gate is any suitable conductive material such as an alloy of doped silicon, such as silicon-germanium ($SiGe_x$) or silicon-carbon ($SiC_x$) and/or other conductive materials including elemental metals (W, Ta, Mo, Ti, Re, Ir, Al, etc.), metal silicides ($CoSi_x$, $NiSi_x$, $WSi_x$, $TiSi_x$), metal nitrides (WN, TaN, TiN, TaSiN) and its alloys. The gate material can be in either crystalline, polycrystalline, or amorphous form and may include multiple layers of various conducting materials.

Silicon nitride spacers 32 and 132 are formed on respective sidewalls of the gates 12 and 112. Liners 30 and 130 such as silicon dioxide are interposed between the silicon nitride spacer and the gate. The liners 30 and 130 are typically L shaped and have a thickness of about 30~120 angstroms. The liners 30 and 130 may further comprise an offset spacer that is known in the art and is thus omitted in the figures.

An x-z coordinate is specifically demonstrated through FIG. 4 to FIG. 11, wherein x-axis represents channel direction between the shallow-junction source extension 17 and a shallow-junction drain extension 19, while z-axis represents the direction between from channel to the gate. A y-axis is the direction that is normal to the paper.

Figure 5:
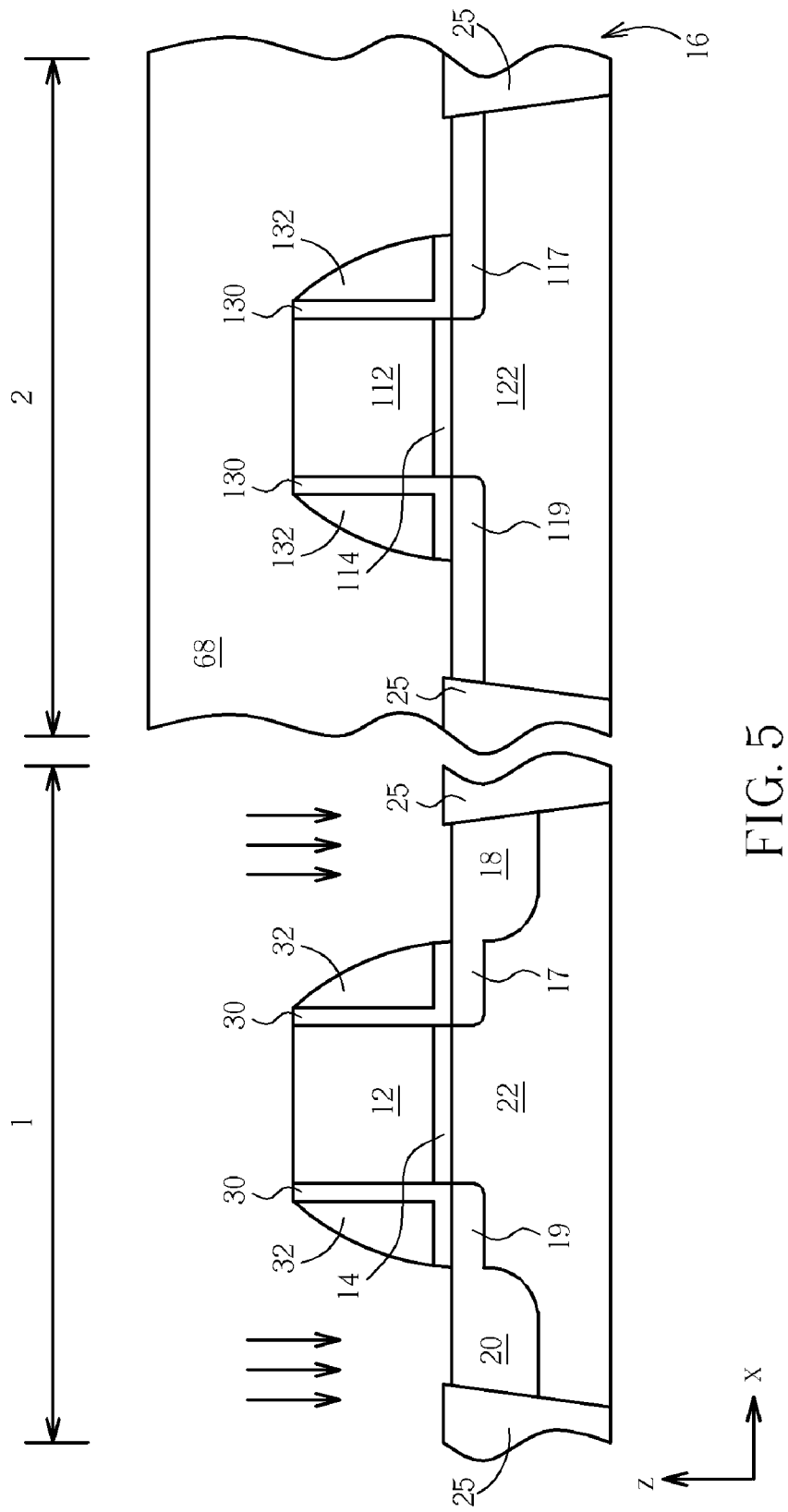

As shown in FIG. 5, after forming the silicon nitride spacers 32 and 132, a mask layer 68 such as a photo resist layer is formed to mask the region 2 only. An ion implantation process is carried out to dope N type dopant species such as arsenic, antimony or phosphorous into the silicon layer 16, thereby forming heavily doped source region 18 and heavily doped drain region 20. The mask layer 68 is then stripped off.

Figure 6:
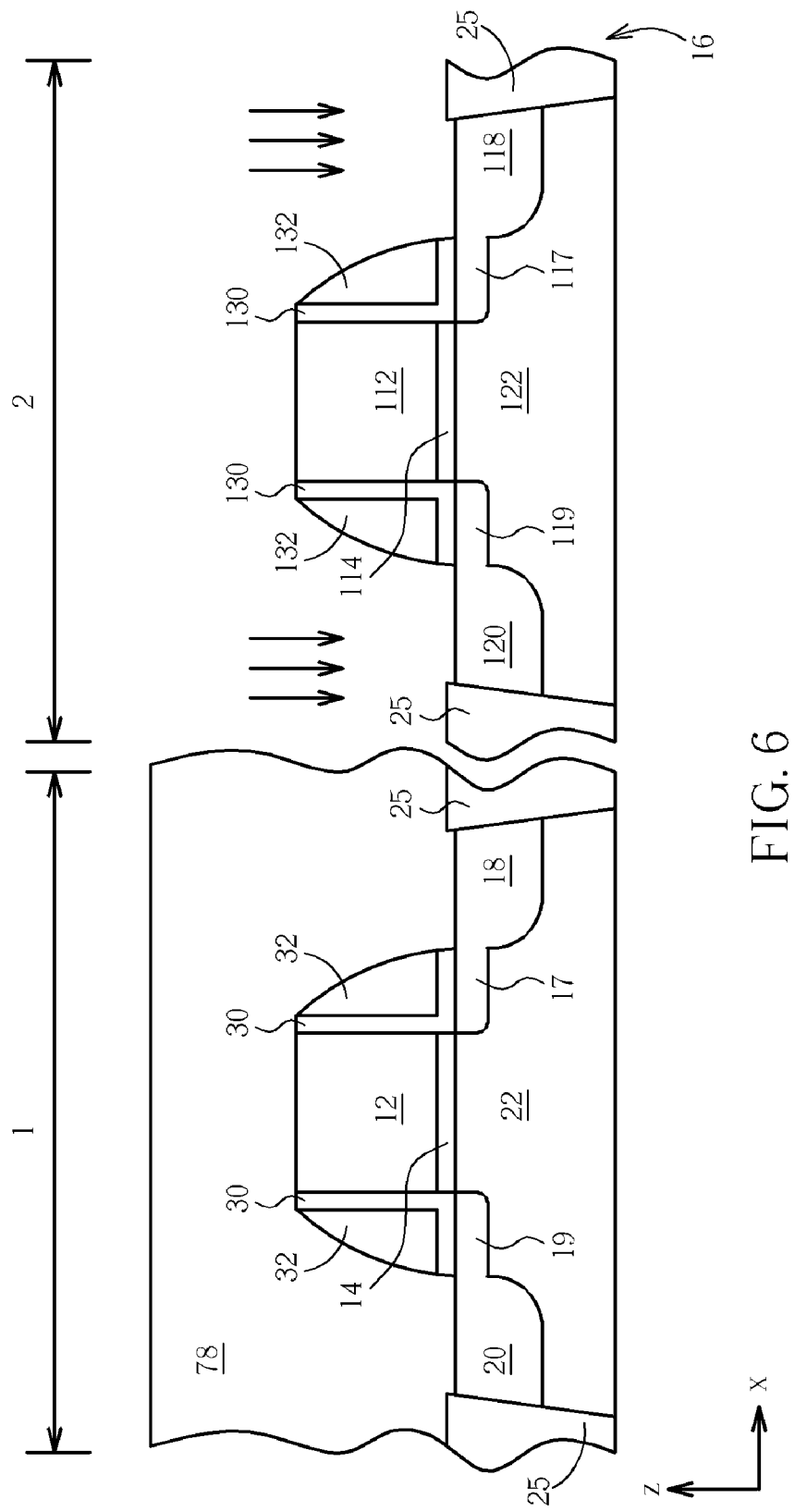

As shown in FIG. 6, a mask layer 78 such as a photo resist layer is formed to only mask the region 1. An ion implantation process is carried out to dope P type dopant species such as boron into the silicon layer 16, thereby forming source region 118 and drain region 120. The mask layer 78 is then stripped off using methods known in the art.

It is to be understood that the sequence as set forth in FIGS. 5 and 6 may be converse. That is, the P type doping for the region 2 may be carried out first, then the N type doping for the region 1. After the source/drain doping, the substrate may be subjected to an annealing and/or activation thermal process that is known in the art.

Figure 7:
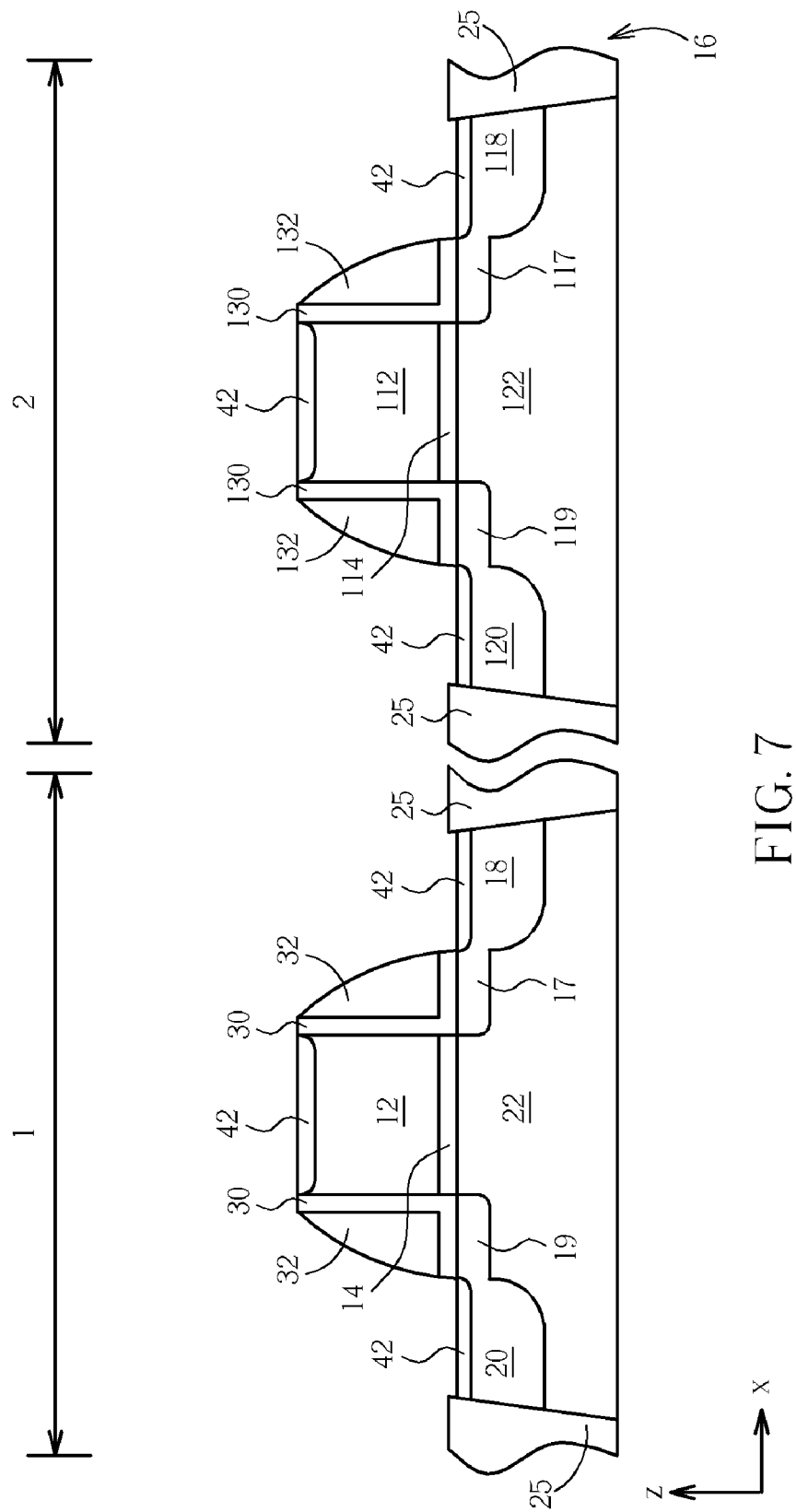

As shown in FIG. 7, a conventional salicide process is performed to form a salicide layer 42 such as nickel salicide layer atop the gates 12 and 122, on the exposed source regions 18 and 118 and also on the exposed drain regions 20 and 120. The salicide process is well known in the art. For example, the salicide process typically comprises blanket sputtering or depositing a metal layer such as cobalt or nickel over the substrate; reacting the metal layer with the silicon surfaces to form silicide; and removing un-reacted metal layer.

Prior to the aforementioned salicide process, an etching process can be performed to etch the exposed source/drain regions, thereby forming a recess (not shown) on the source/drain regions. A SiGe layer is then grown on the recessed source/drain regions of the PMOS transistor, while a SiC layer is grown on the recessed source/drain regions of the NMOS transistor.

Figure 8:
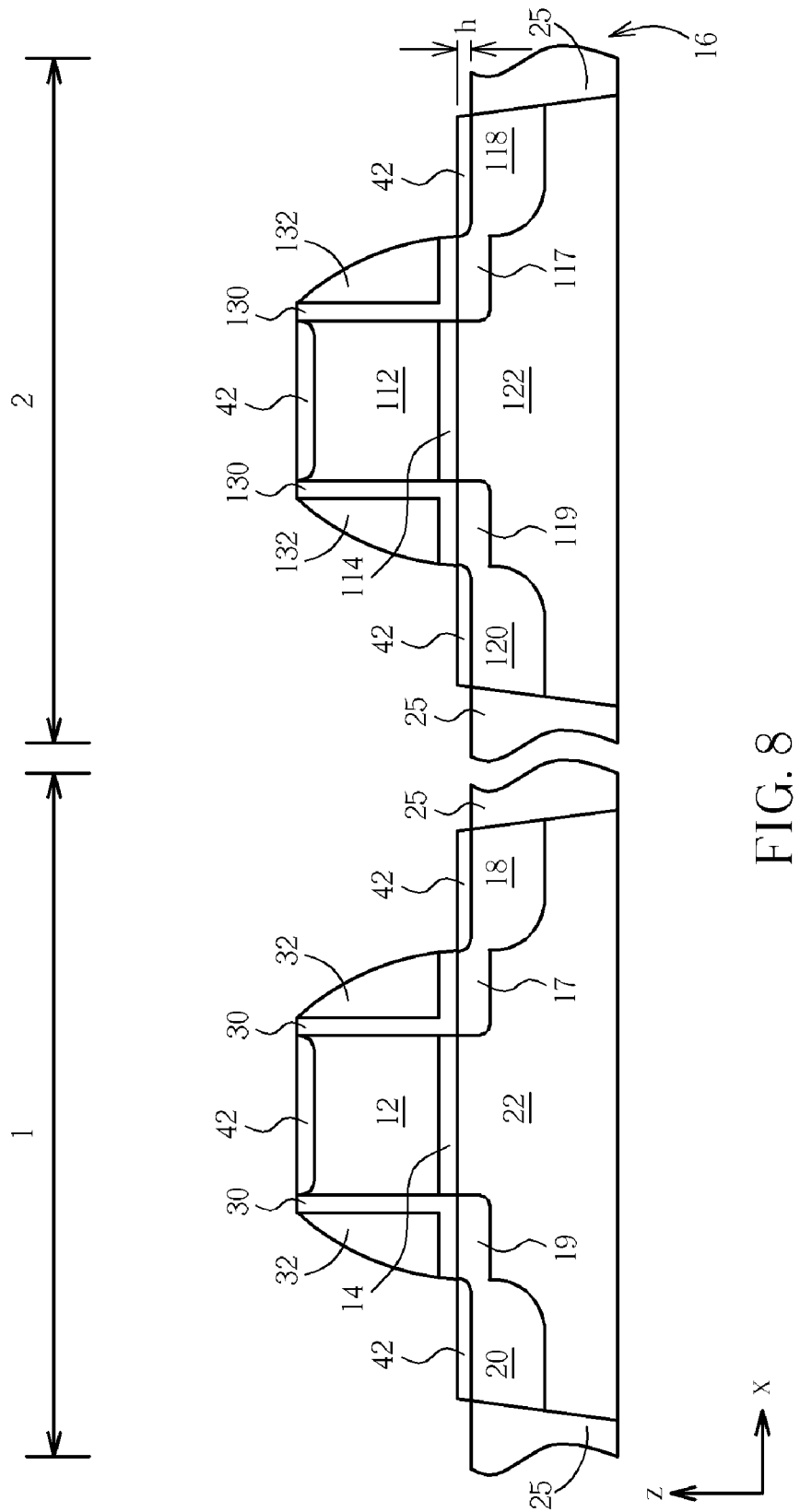

As shown in FIG. 8, an etching process is carried out to remove a pre-determined thickness of the STI structure 25 such that the top surface of the STI structure 25 is lower than that of the adjacent salicide layer 42. It is one feature of the present invention to form a step height h at the interface between the STI structure 25 and the adjacent salicide layer 42. According to the preferred embodiment, the step height h is preferably between 300~1000 angstroms, more preferably 300~500 angstroms. It is noteworthy that the step height h should be in the aforesaid range to prevent contact junction leakage.

Figure 9:
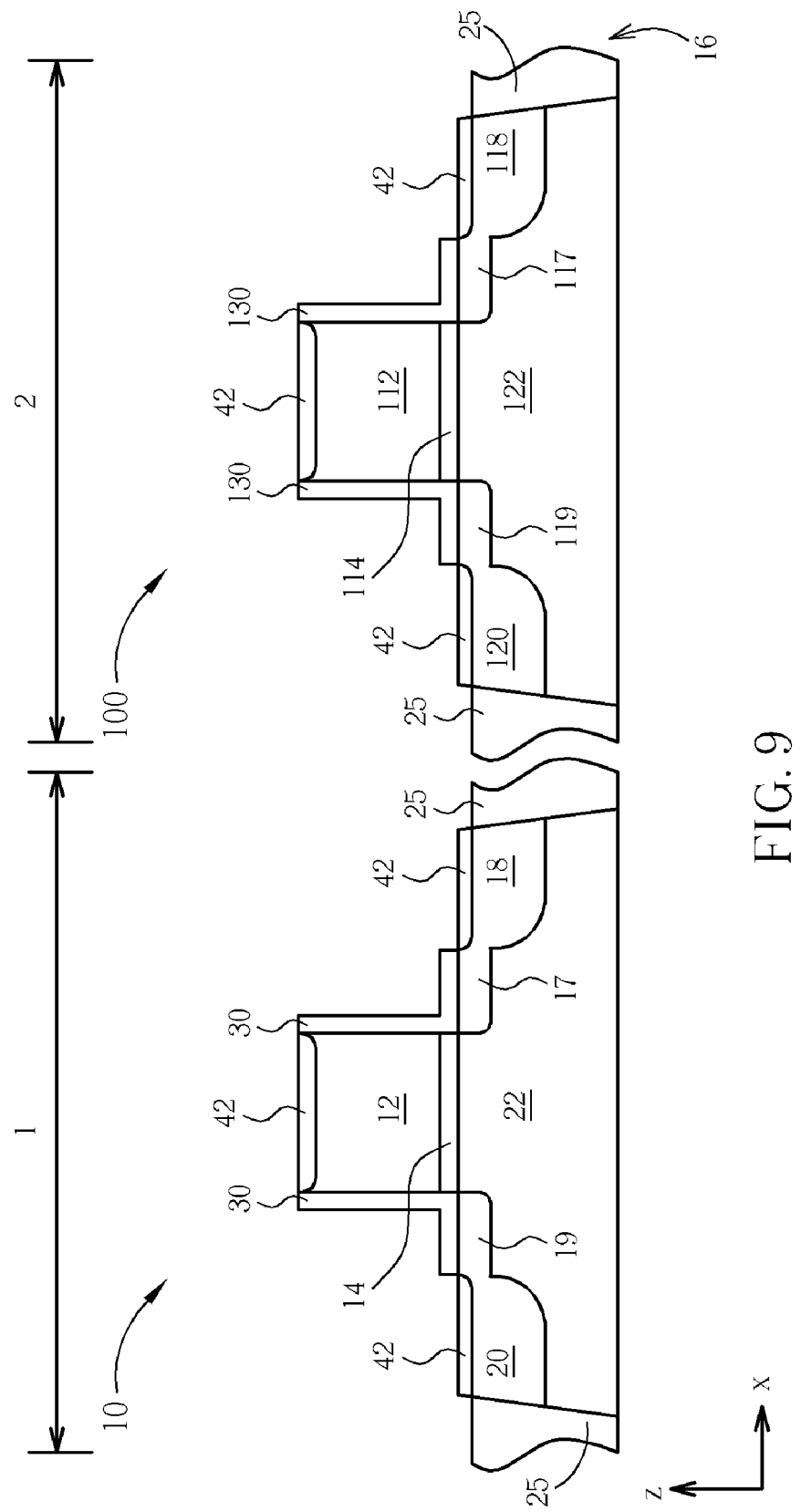

As shown in FIG. 9, subsequently, the silicon nitride spacers 32 and 132 are stripped away, leaving the liners 30 and 130 on the sidewalls intact. According to one preferred embodiment, phosphoric acid is employed to remove the silicon nitride spacers 32 and 132. The present invention features that both the NMOS transistor device 10 and the PMOS transistor device 100 do not have silicon nitride spacers (silicon nitride spacer-less) compared to the prior art MOS transistor devices.

After removing the silicon nitride spacers, approximately L shaped liners are left. However, this invention is not limited to an L shaped liner. It is to be understood that a mild etching process may be carried out to slightly etch the liner, thereby shrinking its thickness. In another case, the liner may be etched away. In general, the liners 30 and 130 have a thickness of about 0 to 500 angstroms.

Figure 10:
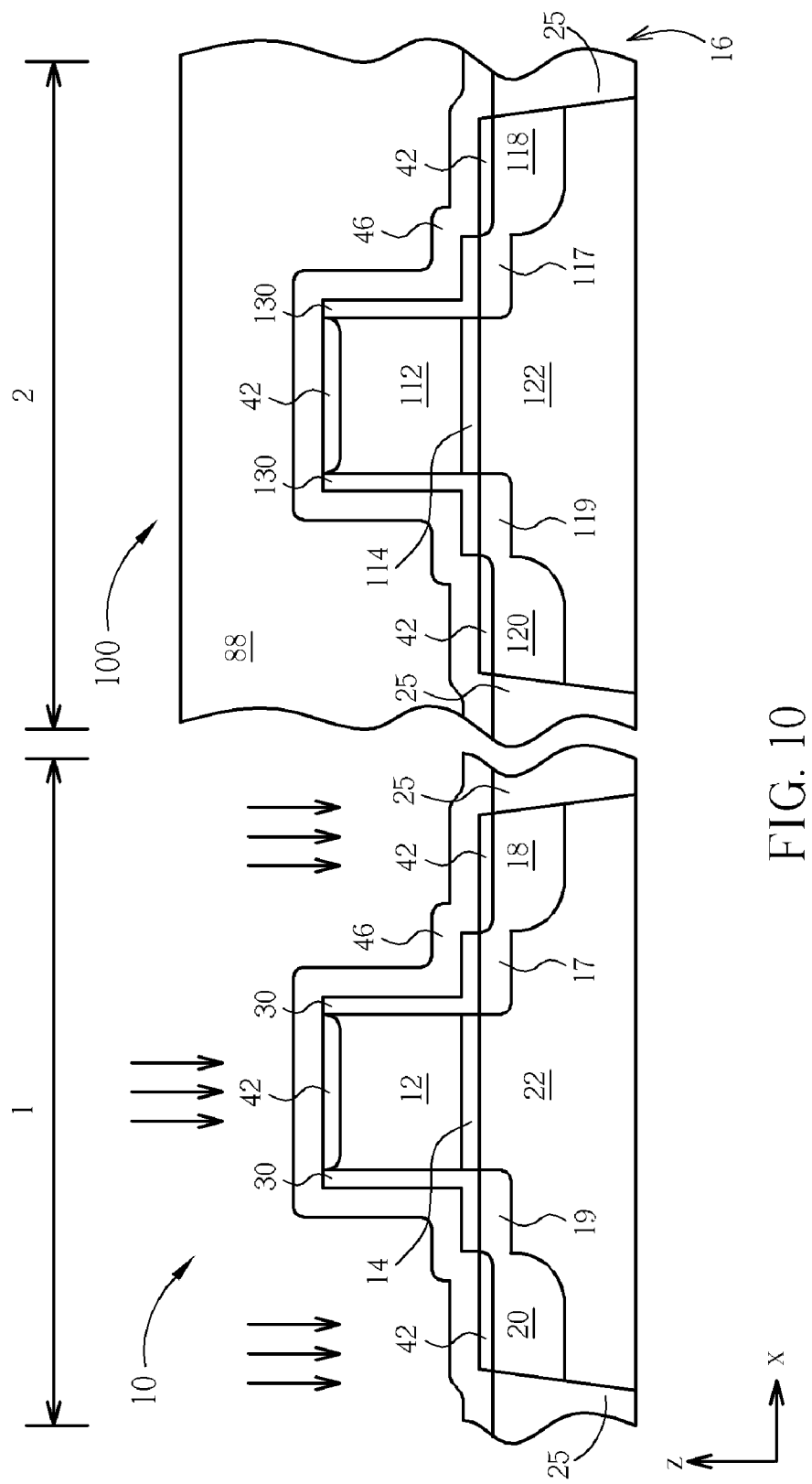

As shown in FIG. 10, in accordance with one preferred embodiment, a conformal silicon nitride cap layer 46 is deposited on the substrate. Preferably, the silicon nitride cap layer 46 has a thickness of about 30~2000 angstroms, for example, about 1000 angstroms. The silicon nitride cap layer 46 directly borders the liners 30 and 130 resting on the sidewalls of the gates 12 and 122 of the NMOS transistor device 10 and the PMOS transistor device 100, respectively.

According to the preferred embodiment, the silicon nitride cap layer 46 is initially deposited in a first stress status such as a compressive-stressed status (ex. −0.1 Gpa~−3 Gpa). Thereafter, the silicon nitride cap layer 46 in the region 2 is covered with a mask layer 88.

The stress of the exposed silicon nitride cap layer 46 within the region 1 is altered to a second stress status that is opposite to the first stress status, i.e., a tensile-stressed status (ex. 0.1 Gpa~3 Gpa) in this case. By doing this, the channel region 22 is tensile-stressed by the silicon nitride cap layer 46, while the channel region 122 is compressively stressed by the silicon nitride cap layer 46, both in the aforesaid channel direction (x direction or x-axis).

According to the preferred embodiment, the alteration of the stress status of the exposed silicon nitride cap layer 46 within the region 1 is accomplished by using a germanium ion implantation. However, it is to be understood that the alteration of the stress status of the exposed silicon nitride cap layer 46 within the region 1 may be accomplished by using other methods known to those skilled in the art.

Furthermore, the electrical performance of both the NMOS transistor device 10 and the PMOS transistor device 100 can be improved due to the step height h at the interface between the STI structure 25 and the salicide layer 42. The stress films deposited on the STI structure 25 impart a secondary stress in the y-axis (i.e., the direction normal to the paper) to the respective transistor devices. To ensure effective improvement provided by the stressed nitride CESL on the performance of the MOS transistors, it is recommended that the step height h is no less than 300 angstroms.

The current gain is illustrated in FIG. 12. FIG. 12 demonstrates the measured current for both N/PMOS transistors (with gate length L of 32 nm and a gate width W of 1 μm) in three different conditions including condition (1): No silicon nitride cap layer and no STI etch back; condition (2): With stressed silicon nitride cap layer and no STI etch back; and condition (3): With both stressed silicon nitride cap layer and STI etch back.

Figure 11:
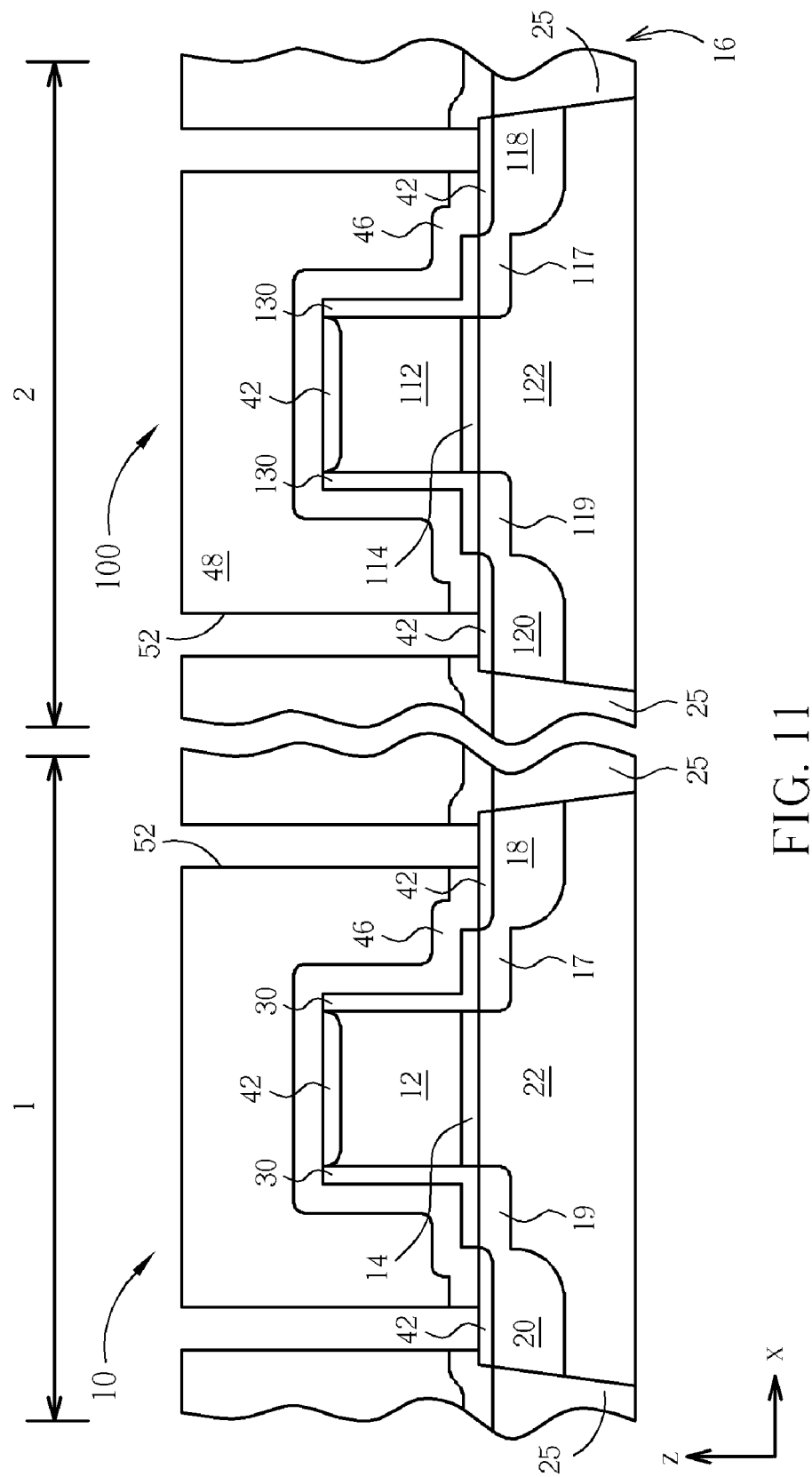

As shown in FIG. 11, subsequently, a dielectric layer 48 is deposited over the regions 1 and 2 on the silicon nitride cap layer 46. The dielectric layer 48 may be made of silicon oxide, doped silicon oxide or other suitable materials such as low-k materials.

According to another embodiment of this invention, the dielectric layer 48 is stressed. For example, the dielectric layer 48 within region 1 is tensile-stressed, while the dielectric layer 48 within region 2 is compressively stressed.

Conventional lithographic and etching processes are then carried out to form contact holes 52 in the dielectric layer 48 and in the silicon nitride cap layer 46. The contact holes 52 communicate with the source/drain regions of the devices 10 and 100. In another case, a contact hole may be formed to communicate with the gate electrode. From one aspect of the present invention, the silicon nitride cap layer 46 acts as an etching stop layer during the dry etching of the contact holes 52 for alleviating surface damages caused by the etchant substances.

It is advantageous to use the present invention method because the NMOS transistor 10 is capped with a tensile-stressed silicon nitride cap layer and the PMOS transistor device is capped with a compressive-stressed silicon nitride cap layer. Since the silicon nitride spacers are removed, the stressed silicon nitride cap layer is therefore disposed more closer with the channels 22 and 122 of the devices 10 and 100, respectively, resulting in improved performance in terms of increased saturation current.

It is one salient feature of the present invention that the recessed STI structure 25 provides a step height h at the interface between the STI structure 25 and the salicide layer 42 of the transistor devices. The stressed silicon nitride films deposited on the STI structure 25 impart a secondary stress in the y-axis to the respective transistors, thereby further improving the electrical performance.

Figure 13:
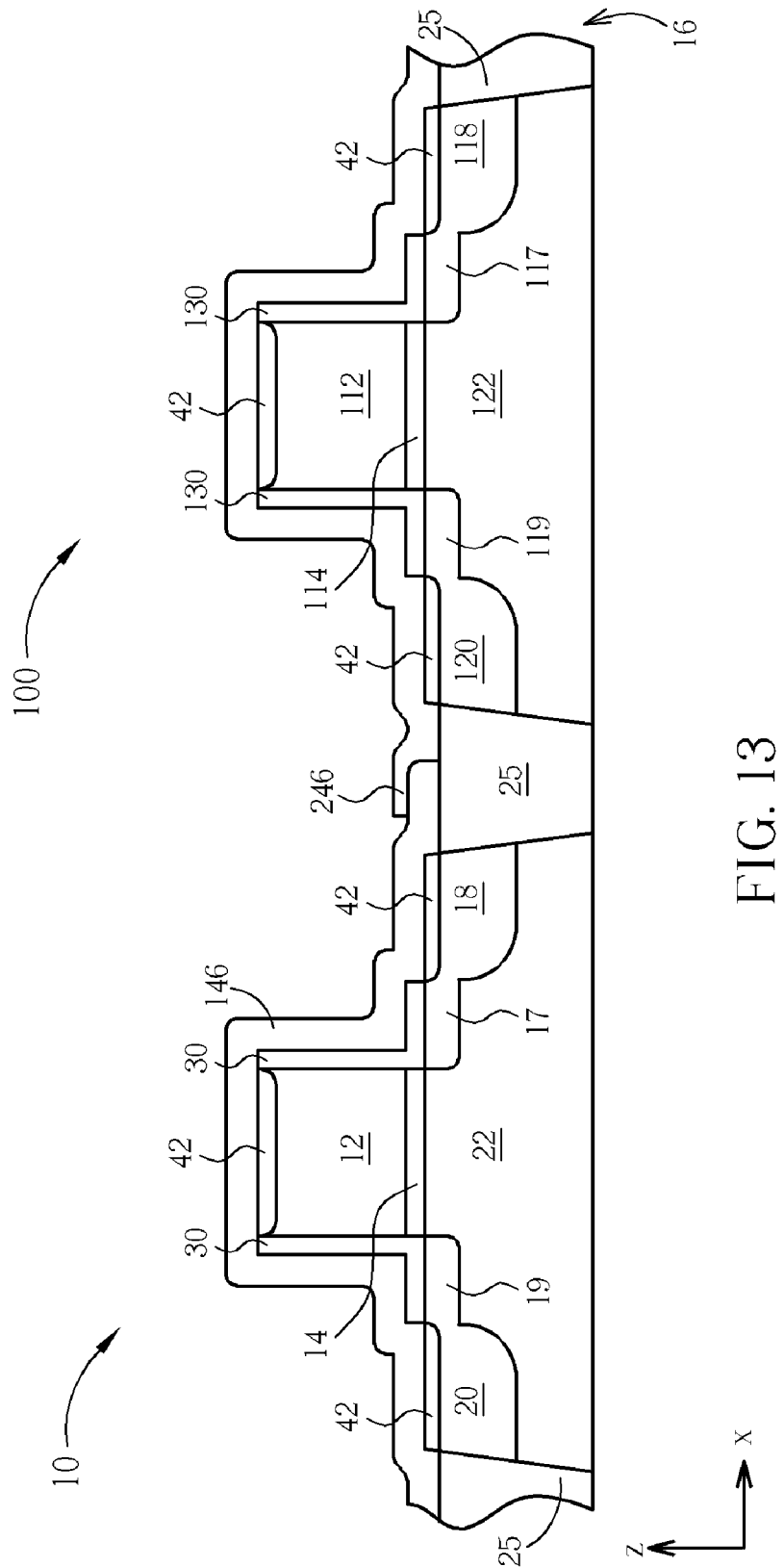
FIG. 13 is a schematic cross-sectional diagram illustrating a semiconductor CMOS transistor device in accordance with another preferred embodiment of the present invention.

Please refer to FIG. 13. FIG. 13 is a schematic cross-sectional diagram illustrating a semiconductor CMOS transistor device in accordance with another preferred embodiment of the present invention. As shown in FIG. 13, the stressed films 146 and 246 covering the N/PMOS transistors are deposited respectively. The silicon nitride cap layers 146 and 246 are tensile-stressed and compressive-stressed, respectively. It is one feature of the present invention that the silicon nitride cap layers 146 and 246 overlap with each other on the STI structure 25, such that an additive stress is created.

Figure 14:
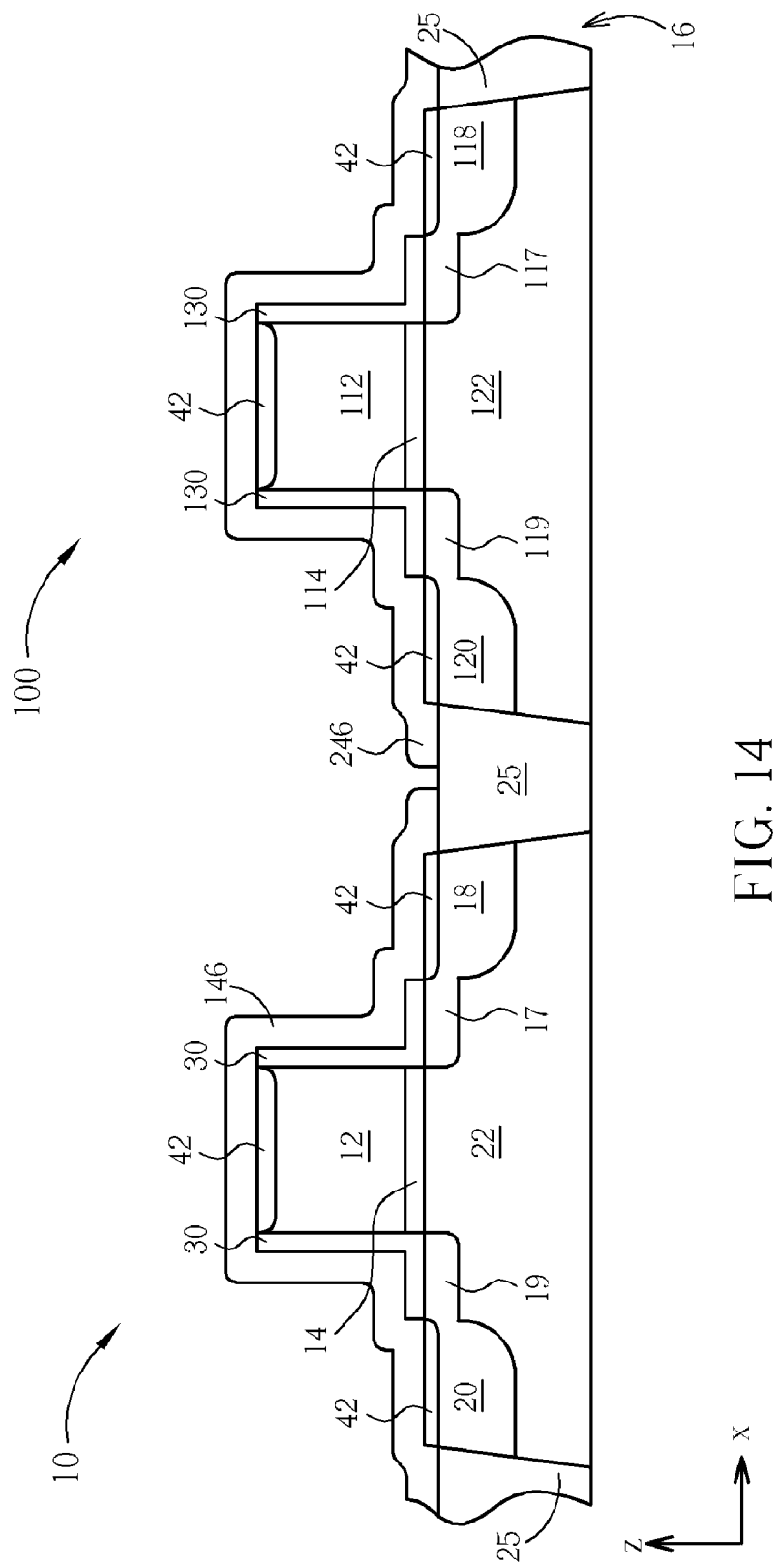
FIG. 14 is a schematic cross-sectional diagram illustrating a semiconductor CMOS transistor device in accordance with still another preferred embodiment of the present invention.

Please refer to FIG. 14. FIG. 14 is a schematic cross-sectional diagram illustrating a semiconductor CMOS transistor device in accordance with still another preferred embodiment of the present invention. As shown in FIG. 14, likewise, the stressed films 146 and 246 covering the N/PMOS transistors are deposited respectively. The silicon nitride cap layers 146 and 246 are tensile-stressed and compressive-stressed, respectively. It is one feature of the present invention that the silicon nitride cap layers 146 and 246 does not overlap with each other on the STI structure 25.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal-oxide-semiconductor (MOS) transistor device, comprising:
    a semiconductor substrate having thereon an active area;
    a shallow trench isolation (STI) region isolating the active area, wherein a step height h is formed between the STI region and the active area;
    a gate dielectric layer on the active area;
    a gate electrode on the gate dielectric layer, wherein the gate electrode has vertical sidewalls and a top surface;
    a liner on the vertical sidewalls of the gate electrode;
    a source region in the active area;
    a drain region separated from the source region by a channel region under the gate electrode;
    a silicide layer formed on the top surface of the gate electrode, on the source region and on the drain region; and
    a stressed cap layer covering the liner and the silicide layer and extending to the STI region, wherein the stressed cap layer has a specific stress status.

2. The MOS transistor device according to claim 1 wherein the MOS transistor device is an NMOS transistor device and wherein the stressed cap layer is tensile-stressed.

3. The MOS transistor device according to claim 1 wherein the MOS transistor device is a PMOS transistor device and wherein the stressed cap layer is compressive-stressed.

4. The MOS transistor device according to claim 1 wherein the semiconductor substrate is a silicon substrate.

5. The MOS transistor device according to claim 1 wherein the liner comprises silicon oxide.

6. The MOS transistor device according to claim 1 wherein the step height h ranges between 300 and 1000 angstroms.

7. The MOS transistor device according to claim 1 wherein the stressed cap layer has a thickness of about 30~2000 angstroms.

8. The MOS transistor device according to claim 1 wherein the stressed cap layer borders the liner and the silicide layer.

9. The MOS transistor device according to claim 1 wherein the stressed cap layer comprises silicon nitride.

10. The MOS transistor device according to claim 1 wherein a dielectric layer is deposited over the stressed cap layer.

11. The MOS transistor device according to claim 1 wherein the liner has a thickness of about 0~500 angstroms.

12. The MOS transistor device according to claim 1 wherein the source/drain region comprises a SiGe layer.

13. The MOS transistor device according to claim 1 wherein the source/drain region comprises a SiC layer.

14. A complementary metal-oxide-semiconductor (CMOS) transistor device, comprising:
    a semiconductor substrate having thereon a first and second active areas;
    a shallow trench isolation (STI) region isolating the first active area from the second active area, wherein a step height h is formed between the STI region and the first or second active area;
    a first and second gate dielectric layers on the first and second active areas, respectively;
    a first and second gate electrodes on the first and second gate dielectric layers, respectively, wherein both of the first and second gate electrodes have vertical sidewalls and a top surface;
    a liner on the vertical sidewalls of the first and second gate electrodes;
    a source/drain region on either side of the first or second gate electrode;
    a silicide layer formed on the top surface of the first and second gate electrodes, and on the source/drain region; and
    a tensile-stressed cap layer covering the liner and the silicide layer on the first active area and extending to the STI region; and
    a compressive-stressed cap layer covering the liner and the silicide layer on the second active area and extending to the STI region.

15. The MOS transistor device according to claim 14 wherein the semiconductor substrate is a silicon substrate.

16. The MOS transistor device according to claim 14 wherein the liner comprises silicon oxide.

17. The MOS transistor device according to claim 14 wherein the step height h ranges between 300 and 1000 angstroms.

18. The MOS transistor device according to claim 14 wherein the stressed cap layer has a thickness of about 30~2000 angstroms.

19. The MOS transistor device according to claim 14 wherein both of the tensile-stressed cap layer and the compressive-stressed cap layer border the liner and the silicide layer.

20. The MOS transistor device according to claim 14 wherein both of the tensile-stressed cap layer and the compressive-stressed cap layer comprise silicon nitride.

21. The MOS transistor device according to claim 14 wherein a dielectric layer is deposited over the tensile-stressed cap layer and the compressive-stressed cap layer.

22. The MOS transistor device according to claim 14 wherein the source/drain region comprises a SiGe layer.

23. The MOS transistor device according to claim 14 wherein the source/drain region comprises a SiC layer.

* * * * *